(12) United States Patent
Chiang

(10) Patent No.: US 8,101,937 B2
(45) Date of Patent: Jan. 24, 2012

(54) MULTISTATE NONVOLATILE MEMORY ELEMENTS

(75) Inventor: Tony Chiang, Campbell, CA (US)

(73) Assignee: Intermolecular, Inc., San Jose, CA (US)

( * ) Notice: Subject to any disclaimer, the term of this patent is extended or adjusted under 35 U.S.C. 154(b) by 346 days.

(21) Appl. No.: 12/179,532

(22) Filed: Jul. 24, 2008

(65) Prior Publication Data
US 2009/0026433 A1 Jan. 29, 2009

Related U.S. Application Data

(60) Provisional application No. 60/962,027, filed on Jul. 25, 2007.

(51) Int. Cl.
*H01L 47/00* (2006.01)
(52) U.S. Cl. .................. 257/2; 257/E47.001; 257/5
(58) Field of Classification Search .................. 257/2, 5, 257/E47.001; 365/148
See application file for complete search history.

(56) References Cited

U.S. PATENT DOCUMENTS

| | | | |
|---|---|---|---|
| 5,278,636 A | 1/1994 | Williams et al. | |
| 5,296,716 A | 3/1994 | Ovshinsky et al. | |
| 5,335,219 A | 8/1994 | Ovshinsky et al. | |
| 5,383,088 A | 1/1995 | Chapple-Sokol et al. | |
| 5,536,947 A | 7/1996 | Klersy et al. | |
| 6,034,882 A | 3/2000 | Johnson et al. | |
| 6,534,784 B2 | 3/2003 | Eliasson et al. | |
| 6,815,744 B1 | 11/2004 | Beck et al. | |
| 6,835,949 B2 | 12/2004 | Weiss et al. | |
| 6,872,963 B2 * | 3/2005 | Kostylev et al. | 257/2 |
| 6,906,939 B2 | 6/2005 | Rinerson et al. | |
| 6,944,052 B2 | 9/2005 | Subramanian et al. | |
| 6,956,757 B2 | 10/2005 | Shepard | |
| 6,965,137 B2 | 11/2005 | Kinney et al. | |
| 7,038,935 B2 | 5/2006 | Rinerson et al. | |
| 7,054,183 B2 | 5/2006 | Rinerson et al. | |
| 7,061,013 B2 * | 6/2006 | Hideki | 257/42 |
| 7,067,862 B2 | 6/2006 | Rinerson et al. | |
| 7,095,644 B2 | 8/2006 | Chevallier et al. | |
| 7,375,365 B2 * | 5/2008 | Hsiung | 257/2 |
| 7,488,968 B2 * | 2/2009 | Lee | 257/4 |
| 7,521,704 B2 * | 4/2009 | Lee et al. | 257/2 |
| 7,524,722 B2 | 4/2009 | Lee et al. | |
| 7,666,526 B2 * | 2/2010 | Chen et al. | 428/697 |
| 7,688,618 B2 * | 3/2010 | Happ et al. | 365/163 |
| 7,718,988 B2 * | 5/2010 | Lee | 257/2 |
| 7,719,886 B2 * | 5/2010 | Philipp et al. | 365/163 |

(Continued)

FOREIGN PATENT DOCUMENTS

KR 1020040104967 A 12/2004

(Continued)

OTHER PUBLICATIONS

Chen, An et al., "Non-Volatile Resistive Switching for Advanced Memory Applications," Dec. 5-7, 2005, IEEE IEDM, 4pp.*

(Continued)

*Primary Examiner* — N Drew Richards
*Assistant Examiner* — Robert Carpenter

(57) ABSTRACT

Multistate nonvolatile memory elements are provided. The multistate nonvolatile memory elements contain multiple layers. Each layer may be based on a different bistable material. The bistable materials may be resistive switching materials such as resistive switching metal oxides. Optional conductor layers and current steering elements may be connected in series with the bistable resistive switching metal oxide layers.

24 Claims, 3 Drawing Sheets

U.S. PATENT DOCUMENTS

| | | | |
|---|---|---|---|
| 2002/0074584 A1 | 6/2002 | Yang | |
| 2005/0051901 A1* | 3/2005 | Chen | 257/758 |
| 2005/0112896 A1* | 5/2005 | Hamann et al. | 438/694 |
| 2005/0151156 A1* | 7/2005 | Wu et al. | 257/107 |
| 2006/0050598 A1 | 3/2006 | Rinerson et al. | |
| 2006/0054950 A1 | 3/2006 | Baek et al. | |
| 2006/0073657 A1 | 4/2006 | Herner et al. | |
| 2006/0076549 A1 | 4/2006 | Ufert | |
| 2006/0097288 A1 | 5/2006 | Baek et al. | |
| 2006/0098472 A1 | 5/2006 | Ahn et al. | |
| 2006/0109704 A1 | 5/2006 | Seo et al. | |
| 2006/0113614 A1 | 6/2006 | Yoo et al. | |
| 2006/0131554 A1 | 6/2006 | Joung et al. | |
| 2006/0151852 A1 | 7/2006 | Senzaki | |
| 2006/0170027 A1 | 8/2006 | Lee et al. | |
| 2006/0171200 A1 | 8/2006 | Rinerson et al. | |
| 2006/0181317 A1 | 8/2006 | Joo et al. | |
| 2006/0193175 A1 | 8/2006 | Khang et al. | |
| 2006/0245243 A1 | 11/2006 | Rinerson et al. | |
| 2006/0250837 A1 | 11/2006 | Herner et al. | |
| 2006/0289942 A1 | 12/2006 | Horii et al. | |
| 2007/0008773 A1 | 1/2007 | Scheuerlein | |
| 2007/0008785 A1 | 1/2007 | Scheuerlein | |
| 2007/0114508 A1 | 5/2007 | Herner et al. | |
| 2007/0114509 A1 | 5/2007 | Herner | |
| 2007/0164309 A1 | 7/2007 | Kumar et al. | |
| 2007/0228354 A1 | 10/2007 | Scheuerlein | |
| 2007/0236981 A1 | 10/2007 | Herner | |
| 2007/0285967 A1 | 12/2007 | Toda et al. | |
| 2008/0007988 A1 | 1/2008 | Ahn et al. | |
| 2008/0090337 A1 | 4/2008 | Williams | |
| 2008/0272363 A1* | 11/2008 | Mouli | 257/14 |
| 2009/0154222 A1 | 6/2009 | Chien et al. | |

FOREIGN PATENT DOCUMENTS

| | | |
|---|---|---|
| KR | 1020050052926 A | 6/2005 |
| KR | 1020060032662 A | 4/2006 |
| KR | 1020060042734 A | 5/2006 |
| KR | 1020060055437 A | 5/2006 |

OTHER PUBLICATIONS

Jang et al. "Transparent Ohmic contacts of oxidized Ru and Ir on p-type GaN", Journal of Applied Physics vol. 93, No. 9, 5416-5421, May 1, 2003.
Beck, A. et al. "Reproducable Switching Effect in Thin Films for Memory Applications" App. Phys. Lett. vol. 77, No. 1, Jul. 3, 2000, pp. 139-141.
Baek, I.G. et al. "Multi-Layer Cross-Point Binary Oxide Reisitive Memory (OxRRAM) for Post-NAND Storage Application" (c) 2005 IEEE.
Baek, I.G., et al. "Highly Scalable Non-volatile Reistive Memory Using Simple Binary Oxide Driven by Asymmetric Unipolar Voltage Pulses" (c) 2004 IEEE (IEDM). pp. 04-587 to 04-590.
Seo, S. et al. "Reproducable Resistance Switching in Polycrystalline NiO films" App. Phys. Lett. vol. 85, No. 23, Dec. 6, 2004, pp. 5655-5657.
Seo, S. et al. "Conductivity Switching Characteristics and Reset Currents in NiO films" App. Phys. Lett. vol. 86, 093509 (2005) pp. 093509-1 to 093509-3.
Seo, S. et al. "Electrode Dependence of Resistance Switching in Polycrystalline NiO films" App. Phys. Lett. vol. 87, 263507 (2005) pp. 263507-1 to 263507-3.
Kim, D.C., et al. "Electrical Observations of Filamentary Conductions for the Resistive Memory Switching in NiO films" App. Phys. Lett. vol. 88, 202102 (2006) pp. 202102-1 to 202102-3.
Kim, D.C. et al. "Improvement of Resistive Memory Switching in NiO using IrO2" App. Phys. Lett. vol. 88, 232106 (2006) pp. 232106-1 to 232106-3.
Kinoshita, K., et al. "Bias Polarity Dependent Data Retention of Resistive Random Access Memory Consisting of Binary Transition Metal Oxide" App. Phys. Lett. vol. 89, 103509 (2006) pp. 103509-1 to 103509-3.
Mallory, G.O., "Chapter 1: The Fundamental Aspects of Electroless Nickel Plating" (pp. 1-56) In "Electroless Plating" Noyes Data Corporation/Noyes Publications (Jan. 1990).
Mallory, G.O., "Chapter 2: The Electroless Nickel Plating Bath: Effect of Variables on the Process" (pp. 57-99) In "Electroless Plating" Noyes Data Corporation/Noyes Publications (Jan. 1990).
Lauwers, A. et al. "CMOS Integration of Dual Work Function Phase Controlled Ni FUSI With Simultaneous Silicidation of NMOS (NiSi) and PMOS (Ni-rich silicide) Gates on HfSiON" (c) 2005 IEEE.
Yoshino, M. et al. "All-wet Fabrication Process of ULSI Interconnect Technologies" Electrochimica Acta 51 (2005) pp. 916-920.
Lee, S. et al. "Effect of Nonstoichiometry of Nickel Oxides on Their Supercapacitor Behavior" Electrochemical and Solid-State Letters 7 (10) (2004) pp. A299-A301.
Jayashree, R.S. et al. "Factors Governing the Electrochemical Synthesis of alpha-nickel (II) hydroxide" Journal of Applied Electrochemistry 29 (1999) pp. 449-454.
Esposito, V. et al. "Electrical Properties of YSZ/NiO Composites Prepared by a Liquid Mixture Technique" Journal of European Ceramic Society 25 (2005) pp. 2637-2641.
Streinz, CC., et al. "The Effect of Current and Nickel Nitrate Concentration on the Deposition of Nickel Hydroxide Films" J. Electrochem. Soc., vol. 142, No. 4, Apr. 1995. pp. 1084-1089.
Murthy, M. et al. "A Model for the Galvanostatic Deposition of Nickel Hydroxide" J. Electrochem. Soc. vol. 143, No. 7, Jul. 1996, pp. 2319-2327.
Serebrennikova I., et al. "Electrochemical Behavior of Sol-Gel Produced Ni and Ni—Co Oxide Films" J. Electrochem. Soc., vol. 144, No. 2, Feb. 1997, pp. 566-572.
Kinoshita, K. et al., "Lowering the Switching Current of Resistance Random Access Memory Using a Hetero Junction Structure Consisting of Transistion Metal Oxides" Japanese Journal of Applied Physics, vol. 45, No. 37, 2006. pp. L991-L994.
Kuo, D., "Characterization of Nonstoichiometric $TiO_2$ and $ZrO_2$ Thin Films Stabilized by $Al_2O_3$ and $SiO_2$ Additions" J. Vac. Sci. Technol. A 21(6). Nov./Dec. 2003, pp. 1996-2002.
Chan, I. et al. "Enhanced Hole Injections in Organic Light-Emitting Devices by Depositing Nickel Oxide on Indium Tin Oxide Anode" App. Phys. Lett. vol. 81, No. 10, Sep. 2002, pp. 1899-1901.
Park, J., "Influence of Oxygen Content on Electrical Properties of NiO Films Grown by RF Reactive Sputtering for Resistive Random-Access Memory Applications" J. Vac. Sci. Technol. B 24(5). Sep./Oct. 2006, pp. 2205-2208.
Park, J. et al. "Reproducible Resistive Switching in Nonstochiometric Nickel Oxide Films Grown by RF Reactive Sputtering for Resistive Random Access Memory Applications" J. Vac. Sci. Technol. A 23 (5), Sep./Oct. 2005 pp. 1309-1313.
Seo, S. et al. "Resistance Switching Mechanism of Metal/Oxide/Metal Structure (NiO)" Presentation of Samsung (undated).
Gibbons, J.F., et al. "Switching Properties of Thin NiO Films" Solid-State Electronics, Pergamon Press 1964, vol. 7, pp. 785-797.
Wohlfahrt, M. et al., "The Mechanism of Electrodeposition and Operation of Ni(OH)2 Layers" Solid State Ionics 86-88 (1996) pp. 841-847.
Hotovy, I., et al., "Deposition and Properties of Nickel Oxide Films Produced by DC Reactive Magnetron Sputtering" Vacuum, vol. 51, No. 2, pp. 157-160 (1998).
Xiang, W. et al. "Heteroepitaxial growth of Nb-doped $SrTiO_3$ films on Si substrates by pulsed laser depostion for resistance memory applications" App. Phys. Lett. vol. 90, 052110 (2007) pp. 052110-1 to 052110-3.
U.S. Appl. No. 11/714,326, filed Mar. 5, 2007, Kumar et al.
U.S. Appl. No. 11/714,334, filed Mar. 5, 2007, Kumar et al.
U.S. Appl. No. 11/702,725, filed Feb. 5, 2007, Chiang et al.
U.S. Appl. No. 11/702,966, filed Feb. 5, 2007, Kumar et al.
U.S. Appl. No. 11/702,967, filed Feb. 5, 2007, Zhi-wen Sun et al.
U.S. Appl. No. 60/928,648, filed May 9, 2007, Kumar et al.
U.S. Appl. No. 12/114,667, filed May 2, 2008, Kumar et al.
U.S. Appl. No. 60/994,183, filed Sep. 17, 2007, Barstow et al.
Yang et al "Memristive switching mechanism for metal/oxide/metal nanodevices", Nature, Nanotechnology vol. 3, Published online: Jun. 15, 2008.
Chen et al "HfOx Thin Films for Resistive Memory Device by Use of Atomic Layer Deposition", Mater. Res. Soc. Symp. Proc. vol. 0997-107-04, 2007.

Kim et al. "Dielectric and electrode thin films for stack-cell structured DRAM capacitors with sub 50-nm design rules", EMRS, Warsaw University of Technology, Sep. 2007.

Torimuri et al. "Doped HfO2 for Higher-k dielectrics", 208th ECS Meeting, Abstract #508, Oct. 2005.

Lee et al. "Low-Power Switching of Nonvolatile Resistive Memory Using Hafnium Oxide", Japanese Journal of Applied Physics, vol. 46, No. 4B, 2007, pp. 2175-2179, Apr. 2007.

Lee et al. "Resistance Switching Behaviors of Hafnium Oxide Films Grown by MOCVD for Nonvolatile Memory Applications", Journal of the Electrochemical Society, 155 (2) H92-H96, Dec. 2007.

"Why MIIM", Phiar Corporation, [online] <http://www.phiar.com/whyMIIM.php4>, retrieved Aug. 8, 2008.

* cited by examiner ns that facilitates switching. In a nonvolatile
MULTISTATE NONVOLATILE MEMORY ELEMENTS This application claims the benefit of provisional patent application No. 60/962,027, filed Jul. 25, 2007, which is hereby incorporated by reference herein in its entirety.

BACKGROUND

This invention relates to nonvolatile memory elements, and more particularly, to multistate nonvolatile memory elements.

Nonvolatile memory elements are used in systems in which persistent storage is required. For example, digital cameras use nonvolatile memory cards to store images and digital music players use nonvolatile memory to store audio data. Nonvolatile memory is also used to persistently store data in computer environments.

Nonvolatile memory is often formed using electrically-erasable programmable read only memory (EPROM) technology. This type of nonvolatile memory contains floating gate transistors that can be selectively programmed or erased by application of suitable voltages to their terminals.

As fabrication techniques improve, it is becoming possible to fabricate nonvolatile memory elements with increasingly small dimensions. However, as device dimensions shrink, scaling issues are posing challenges for traditional nonvolatile memory technology. This has led to the investigation of alternative nonvolatile memory technologies, including resistive switching nonvolatile memory.

Resistive switching nonvolatile memory is formed using memory elements that have two or more stable states with different resistances. Bistable memory has two stable states. A bistable memory element can be placed in a high resistance state or a low resistance state by application of suitable voltages or currents. Voltage pulses are typically used to switch the memory element from one resistance state to the other. Nondestructive read operations can be performed to ascertain the value of a data bit that is stored in a memory cell.

Higher memory densities enable greater storage capabilities with smaller form factors. Traditionally this is achieved by shrinking device dimensions (e.g. memory cell size), stacking memory arrays vertically on a single chip, stacking memory chips in integrated packages, and combinations thereof. However, the above methods may introduce additional cost and complexity. It would therefore be desirable to further increase the densities of nonvolatile memories without relying solely on physical scaling and/or stacking alone.

SUMMARY

In accordance with the present invention, multistable nonvolatile memory elements are provided. The multistable nonvolatile memory elements may be provided in an array on an integrated circuit such as a memory device.

The nonvolatile memory elements may contain multiple bistable layers. The bistable layers may be formed of resistive switching materials such as metal oxides. Current steering elements and conductive layers may be connected in series with the bistable resistive switching layers.

Each resistive switching layer may have an associated high resistance state and an associated low resistance state. The state of each resistive switching layer may be controlled by application of suitable control voltages. For example, a resistive switching layer may be moved from its high resistance state into its low resistance state by application of a set voltage. Once in its high resistance state, a reset voltage may be applied to restore the resistive switching layer to its low resistance state. The reset voltage may have the same polarity as the set voltage or may have an opposite polarity (i.e., in a bipolar arrangement, the reset voltage may be negative while the set voltage is positive).

Each resistive switching layer preferably has a different associated set voltage. The current versus voltage characteristics of each of the resistive switching layers are also staggered in a way that facilitates switching. In a nonvolatile memory device with two bistable resistive switching layers, for example, the resistance of a first of the two layers when in its high resistance state is higher than the resistance of a second of the two layers when in its high resistance state. Additionally, the resistance of the first layer in its low resistance state and the resistance of the second layer in its low resistance state are both lower than either the resistance of the first layer in its high resistance state or the resistance of the second layer in its high resistance state.

Nonvolatile memory elements may have any suitable number of resistive switching layers. If a memory element has n resistive switching layer, where n is a positive integer, the memory element may exhibit n+1 stable states.

Further features of the invention, its nature and various advantages will be more apparent from the accompanying drawings and the following detailed description.

DETAILED DESCRIPTION

The present invention relates to nonvolatile memory elements having multiple stable states. The nonvolatile memory elements may be formed of any suitable layers of multistable material. In accordance with an illustrative embodiment of the present invention, which is described herein as an example, multistable nonvolatile memory elements are formed from multiple layers of resistive switching material. The resistive switching layers may be, for example, bistable layers of metal oxide.

Nonvolatile memory elements in accordance with the invention may be formed on any suitable type of integrated circuit. Most typically, memory elements may be formed as part of a high-capacity nonvolatile memory integrated circuit. Nonvolatile memory integrated circuits are often used in portable devices such as digital cameras, mobile telephones, handheld computers, and music players. In some arrangements, a nonvolatile memory device may be built into mobile equipment such as a cellular telephone. In other arrangements, nonvolatile memory devices are packaged in memory cards or memory keys that can be removably installed in electronic equipment by a user.

The use of nonvolatile memory elements to form memory arrays on memory devices is merely illustrative. In general, any suitable integrated circuit may be formed using the memory element structures of the present invention. Memory arrays formed from nonvolatile memory elements are described herein as an example.

Figure 1:
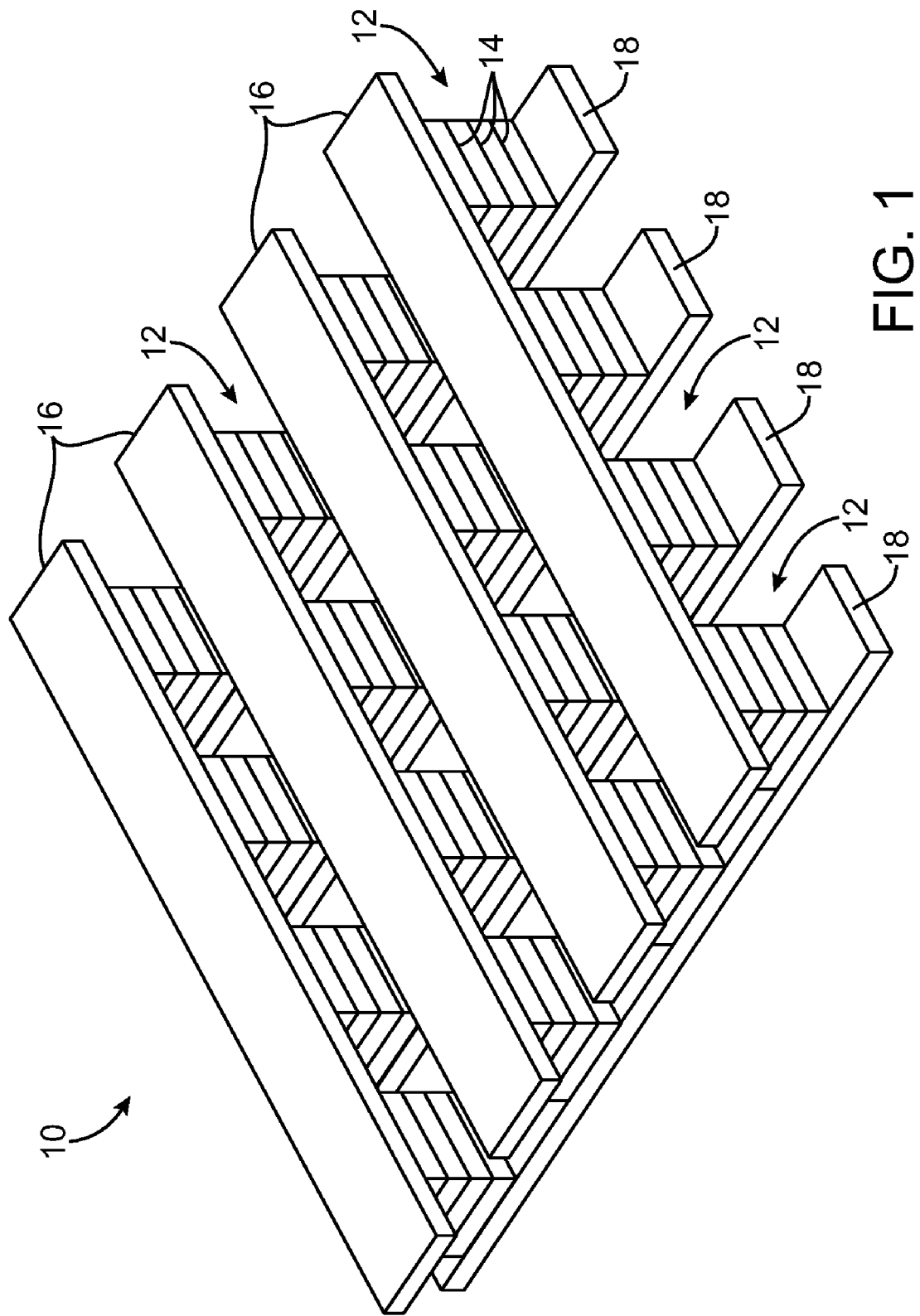
FIG. 1 is a diagram of an illustrative array of multistate nonvolatile memory elements in accordance with an embodiment of the present invention.

An illustrative memory array 10 of nonvolatile memory elements 12 is shown in FIG. 1. Memory array 10 may be part of a memory device or other integrated circuit. Read and write circuitry is connected to memory elements 12 using conductors 16 and orthogonal conductors 18. Conductors such as conductors 16 and conductors 18 are sometimes referred to as word lines and bit lines and are used to read and write data into the elements 12 of array 10. Individual memory elements 12 or groups of memory elements 12 can be addressed using appropriate sets of conductors 16 and 18.

Memory elements 12 may be formed from one or more layers of materials, as indicated schematically by lines 14 in FIG. 1. In addition, memory arrays such as memory array 10 can be stacked in a vertical fashion to make multilayer memory array structures.

During a read operation, the state of a memory element 12 can be sensed by applying a sensing voltage to an appropriate set of conductors 16 and 18. The resistance of the memory element at the sensing voltage can be determined by measuring the amount of current that flows through the memory element when the sensing voltage is applied.

Depending on its history, a memory element that is addressed in this way may be in one of multiple different states. The number of stable states that a particular memory element supports generally depends on the number of resistive switching layers that the memory element contains. For example, a memory element that contains a single bistable resistive switching layer may exhibit two stable states, whereas a memory element that contains two bistable resistive switching layers may exhibit three stable states. Similarly, a memory element that contains n bistable resistive switching layers, may exhibit n+1 stable states. The value of n may be any positive integer (e.g., two, three, four, five, etc.).

As an example, consider a memory element that contains a single bistable resistive switching layer. Memory elements of this type may be in either a high resistance state or a low resistance state. If the memory element has a high resistance, the memory element may be said to contain a logic one (i.e., a "1" bit). If, on the other hand, the memory element has a low resistance, the memory element may be said to contain a logic zero (i.e., a "0" bit). During a write operation, the state of the memory element can be changed by application of suitable write signals to an appropriate set of conductors 16 and 18.

The voltage that is used to change a memory element from its high resistance state to its low resistance state is generally referred to as the memory element's set voltage. When a voltage equal to the set voltage is applied to the memory element, the memory element transitions from its high resistance state to its low resistance state. A read voltage may be applied to the memory element to detect its resistance state (high or low).

The voltage that is used to change a memory element back to its high resistance state from its low resistance state is generally referred to as its reset voltage. When a memory element is in its low resistance state and a voltage equal to the reset voltage is applied, the memory element will transition to its high resistance state.

Multistate nonvolatile memory elements in accordance with the invention preferably contain two or more bistable layers connected in series. As an example, consider a memory element that contains two bistable resistive switching layers connected in series. Each of the resistive switching layers may be formed from a different material (e.g., materials with different compositions, materials fabricated using different fabrication techniques, materials with different dopings, materials with different crystallinities, materials with different thicknesses, etc.), so that each of the resistive switching layers may have a different corresponding set voltage. In this situation, the memory element may exhibit three stable states (e.g., when both resistive switching layers are in their reset or high resistance state, when one of the resistive switching layers has been set and is in its low resistance state, and when both of the resistive switching layers have been set and are in their low resistance states).

A memory element may also have three bistable resistive switching layers connected in series, each having a different respective set voltage. A memory element of this type may exhibit four stable states.

Memory elements with more than three bistable resistive switching layers connected in series may also be formed. In general, a memory element with n bistable layers will exhibit n+1 stable states.

As these examples demonstrate, providing memory elements with additional layers of bistable resistive switching material allows the memory elements to exhibit additional stable states. This increases the information storing capacity of each individual memory element, without significantly increasing the area occupied by the memory element. A bistable element may store one bit (e.g., 1 or 0), whereas a multistable memory element with four stable states may store two bits. The additional stable states that are available in multistate memories with two or more bistable layers i) allow memory arrays such as memory array 10 of FIG. 1 to exhibit high capacities and ii) reduce the number of stacked memory arrays 10 necessary to achieve the equivalent density.

Figure 2:
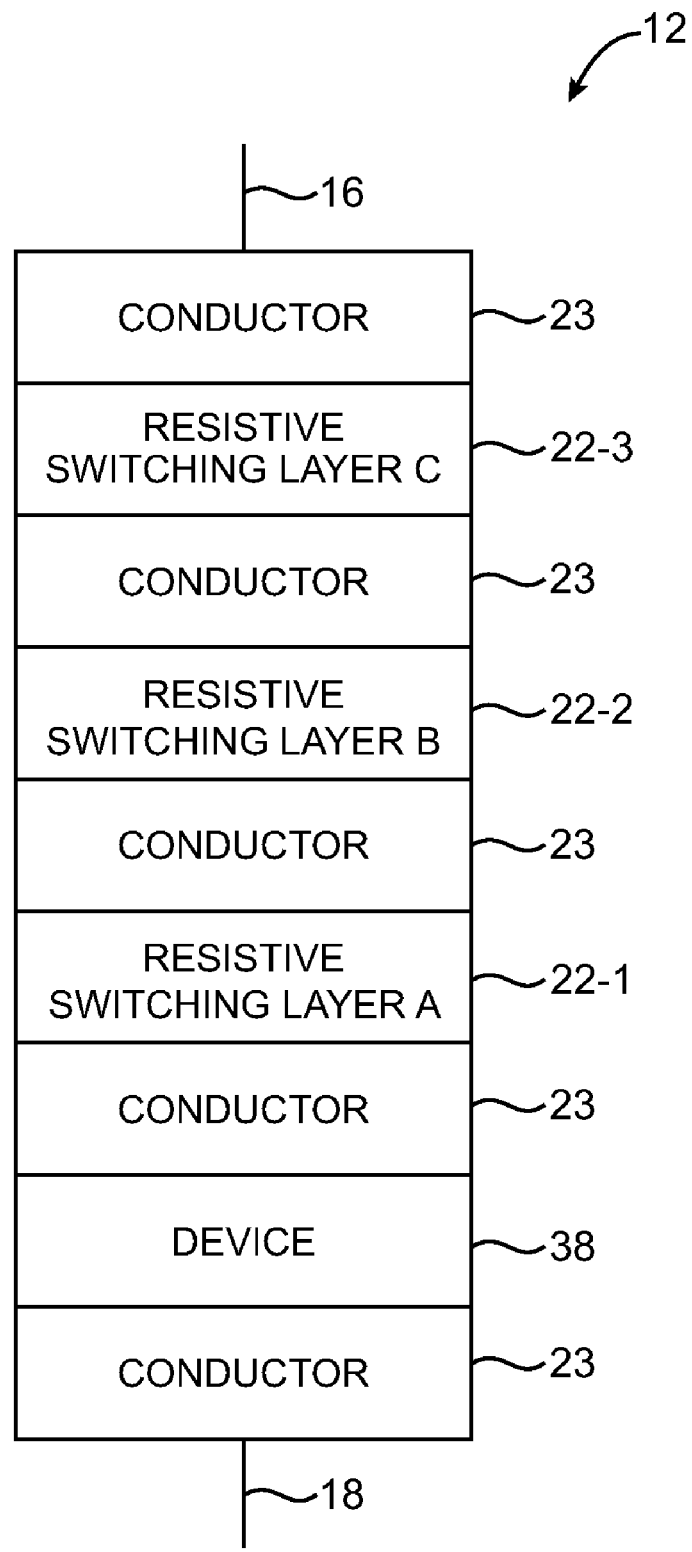
FIG. 2 is a cross-sectional view of an illustrative resistive multistate nonvolatile memory element in accordance with an embodiment of the present invention.

A cross-section of an illustrative embodiment of a resistive switching memory element is shown in FIG. 2. In the example of FIG. 2, memory element 12 is formed from three resistive switching layers 22-1, 22-2, and 22-3 that are connected in series between lines 16 and 18. Resistive switching layers such as 22-1, 22-2, and 22-3 preferably each have a different respective associated set voltage, so that the state of each of the resistive switching layers can be controlled independently. The resistive switching layers may be arranged in any suitable order.

Any suitable materials may be used to form the resistive switching layers in memory element 12. With one suitable arrangement, which is described herein as an example, the resistive switching layers may be formed from metal oxides. For example, resistive switching layer 22-1 may be formed from titanium oxide, resistive switching layer 22-2 may be formed from doped nickel oxide, and resistive switching layer 22-3 may be formed from nickel oxide. Other suitable materials that may be used, in any combination, for resistive switching layers in device 12 include doped titanium oxide, aluminum oxide, doped aluminum oxide, niobium oxide, doped niobium oxide, hafnium oxide, doped hafnium oxide, or other transition metals oxides such as cobalt oxide, doped cobalt oxide, copper oxide, doped copper oxide, zirconium oxide, doped zirconium oxide, vanadium oxide, doped vanadium oxide, tantalum oxide, doped tantalum oxide, zirconium oxide, doped zirconium oxide, cobalt oxide, doped cobalt oxide, copper oxide, doped copper oxide, vanadium oxide, doped vanadium oxide, tantalum oxide, doped tantalum oxide, chromium oxide, doped chromium oxide, molybdenum oxide, doped molybdenum oxide, tungsten oxide, doped tungsten oxide, manganese oxide, and doped manganese oxide. Other resistive-switching materials may also be used.

Examples of dopants that may be incorporated into metal oxide resistive switching layers include Al, Ti, Co, Zr, V, and Nb. Appropriate dopants for each resistive switching layer may be selected based on the base metal oxide that is used for the resistive switching layer.

As shown in FIG. 2, one or more layers of conductor 23 may be optionally connected in series with the series-connected resistive switching layers. If desired, there may be a layer of conductor adjacent to each resistive switching layer, there may be layers of conductor only at the topmost and bottommost positions of the resistive layer stack, there may be a layer of conductor only at the top or only at the bottom of the stack, or there may be any other suitable number of layers of conductor 23 in device 12.

The conductive layers 23 and conductive lines 16 and 18 may be formed from any suitable materials. For example, conductive layers 23 and lines 16 and 18 may be formed from metals such as refractory or transition metals, metal alloys, metal nitrides (e.g., refractory metal nitrides, $Ti_{1-x}Al_xN_y$, $Ta_{1-x}Al_xN_y$, $W_{1-x}Al_xN_y$, $Mo_{1-x}Al_xN_y$, etc.) metal silicon nitrides (i.e., materials containing refractory metals, transition metals, or other metals, along with silicon and nitrogen), metal silicides, doped semiconductors, or other conductors. In one embodiment, conductive lines 16 and 18 may be formed from Al, W, or Cu based interconnects. Other intermediate layers having various functions may also be included. For example, interfacial layers may be included between the resistive switching material 22 and the conductor 23 to modify the work function and/or adhesion properties of the conductor 23.

Conductors 23 are sometimes referred to as electrodes. If desired, conductive line 16 and conductive line 18 may serve as both conductive lines and as electrodes. In this type of arrangement, line 16 may serve as an upper electrode, so that no separate conductor 23 is needed to form an upper electrode for element 12. Similarly, line 18 may serve as a lower electrode, so that no separate conductor is needed to form a lower electrode of element 12.

If desired, one or more optional electrical components may be connected in series with memory element 12. These components, which are sometimes referred to as current steering elements, may include, for example, diodes, p-i-n diodes, silicon diodes, silicon p-i-n diodes, transistors, etc. In the illustrative diagram of FIG. 2, one such current steering element 38 is connected in series with the resistive switching layers 22-1, 22-2, and 22-3 in the lower portion of device 12. This is merely an illustrative arrangement. There may be two or more current steering elements connected in series with the other components of device 12. The current steering elements may be connected in series to the outermost resistive layers (e.g. either resistive switching layer C or resistive switching layer A as shown in FIG. 2) so as to not be interspersed between the resistive switching layers.

The layers of material in device 12 may have any suitable thickness (e.g., 5-5000 angstroms) and may be deposited using any suitable fabrication technique (e.g., physical or chemical vapor deposition, electrochemical deposition, electroless deposition, ion implantation, etc.).

The resistive switching layers such as layers 22-1, 22-2, and 22-3 each exhibit a bistable resistance. When a layer is in its high resistance (resistive) state, it exhibits a relatively high resistance. When a layer is in its low resistance (resistive) state, it exhibits a lower resistance.

Figure 3:
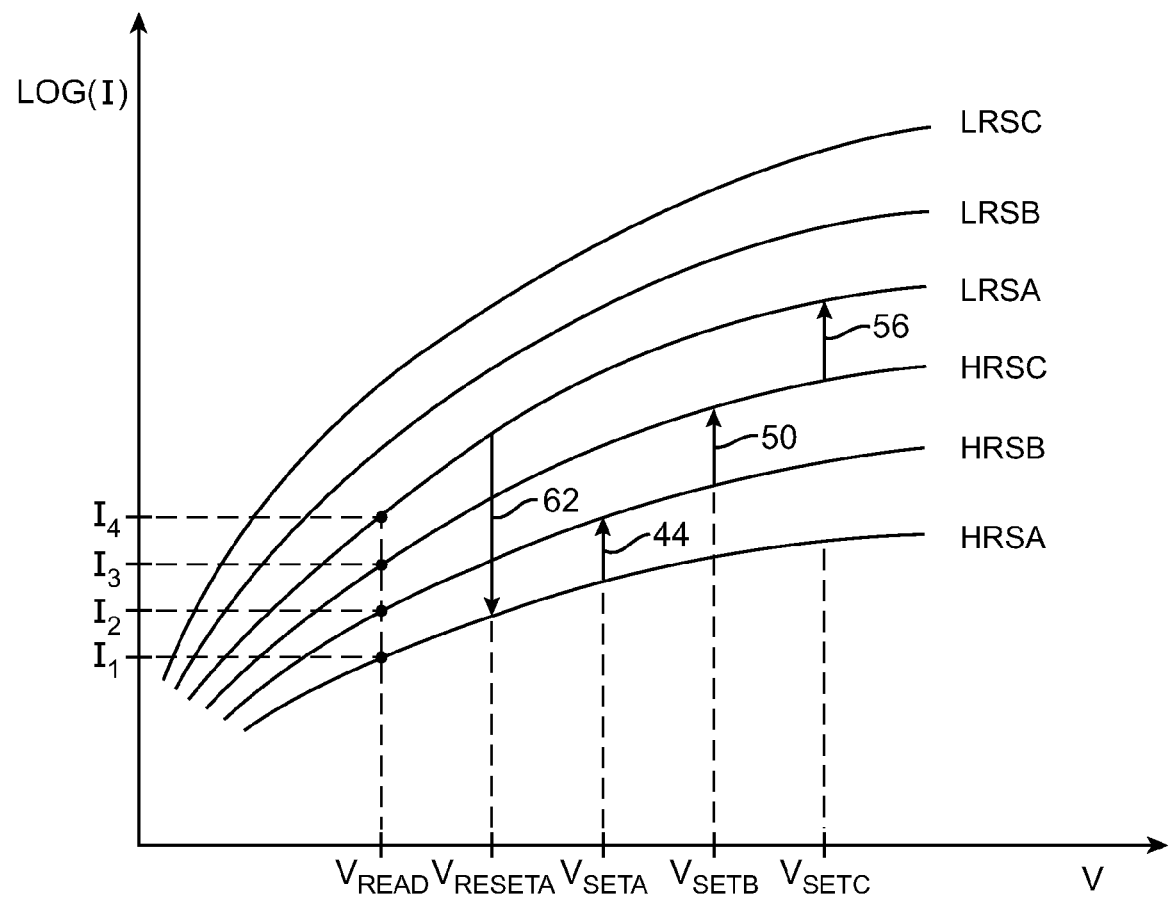
FIG. 3 is a graph showing how a multistate nonvolatile memory element of the type shown in FIG. 2 may exhibit multistable behavior in accordance with an embodiment of the present invention.

An illustrative current (I) versus voltage (V) plot for a device 12 of the type shown in FIG. 2 that has three bistable resistive switching layers is shown in FIG. 3. There are three different bistable resistive switching layers 22-1, 22-2, and 22-3 in device 12, so there are three corresponding pairs of current versus voltage characteristics. The high resistance state of resistive switching layer 22-1 is depicted by line HRSA. The low resistance state of resistive switching layer 22-1 is depicted by line LRSA. The high resistance state of resistive switching layer 22-2 is depicted by line HRSB. The low resistance state of resistive switching layer 22-2 is depicted by line LRSB. The high resistance state of resistive switching layer 22-3 is depicted by line HRSC. The low resistance state of resistive switching layer 22-3 is depicted by line LRSC.

The current versus voltage characteristics of FIG. 3 represents the currents that would flow through each layer as a function of applied voltage if measured individually. These characteristic curves are plotted together in the graph of FIG. 3 to show the relationships between the curves.

The resistance of device 12 is determined by the sum of the resistances of each resistive switching layer. In some preferred embodiments, however, because the resistances of the layers differ significantly (e.g., by an order of magnitude), the resistances of the lower resistance resistive switching layers can be neglected when determining the total resistance of the device 12. For example, as shown in FIG. 3, the resistance of HRSA is greater than the resistance of HRSB, which is greater than the resistance of HRSC, which is further is greater than the resistance of LRSA, and so on. When the layer 22-1 is in its high resistance state, the total resistance of device 12 appears to be approximately HRSA, since the resistance of HRSA is an order of magnitude greater than the resistance of HRSB. When the layer 22-1 switches to its low resistance state LRSA, the output of the device 12 then appears to have a resistance of HRSB, and so on. In some embodiments, the resistance of every high resistance state is greater than the resistance of every low resistance state, so the lowest high resistance state (e.g., HRSC) has a greater resistance than the highest low resistance state (e.g., LRSA). As a result, in any given stable state of device 12, the series resistance of device 12 will be substantially equal to the resistance of the most resistive switching layer.

The states of the resistive switching layers can be controlled by application of suitable voltages across device 12 (i.e., between lines 16 and 18). Initially, device 12 may be in a state in which all resistive switching layers including resistive switching layer 22-1 are in their high resistance states. In this case, the series resistance of device 12 will be determined by the shape of line HRSA. When a read voltage $V_{READ}$ is applied to device 12, the measured current will be $I_1$, indicating that device 12 is in its first stable state (i.e., its highest resistance state).

To place device 12 in its second stable state, a voltage of $V_{SETA}$ may be applied to device 12, where $V_{SETA}$ represents the set voltage for resistive switching layer 22-1. When the voltage $V_{SETA}$ is applied to device 12, most of the voltage drop in device 12 appears across its most resistive layer (i.e., resistive switching layer 22-1). As a result, the voltage across layer 22-1 is substantially equal to $V_{SETA}$. This causes layer 22-1 to transition from its high resistance state (line HRSA) to its low resistance state (line LRSA).

When layer 22-1 transitions to its low resistance state, layer 22-1 is no longer the most resistive layer in device 12. Rather, layer 22-2, which is in its high resistance state, becomes the most resistive layer. Accordingly, application of voltage $V_{SETA}$ causes the output of device 12 to transition from line HRSA to line HRSB, as shown by line 44 in FIG. 3. At this stage, device 12 is in its second stable state. The state of device 12 may be sensed by applying voltage $V_{READ}$ to device 12 and measuring the resulting current ($I_2$).

In a similar fashion, device 12 may be placed in its third and fourth stable states.

To place device 12 in its third stable state, a voltage of $V_{SETB}$ is applied. In this situation, most of the voltage drop in device 12 appears across layer 22-2 as the resistance of layer 22-2 dominates device 12. This causes layer 22-2 to transition from its high resistance state to its low resistance state and causes the output of device 12 to move from line HRSB to line HRSC, as indicated by line 50. The third stable state of device 12 may be sensed by applying read voltage $V_{READ}$ and measuring the resulting current ($I_3$).

Device 12 is placed in its fourth stable state when the voltage $V_{SETC}$ is applied. This causes the third resistive switching layer 22-3 to transition from its high resistance state to its low resistance state. As indicated by line 56, the output of device 12 transitions from the line HRSC, where the output of device 12 is dominated by the resistance of layer 22-3 in its high resistance state to the line LRSA, where the output of device 12 is dominated by the most resistive of the three low resistance states—the low resistance state associated with resistive switching layer 22-1 (line LRSA). When placed in its fourth stable state in this way, device 12 will exhibit a current of $I_4$ when the read voltage $V_{READ}$ is applied. The magnitude of the set and reset voltages may vary, but preferably there is at least greater than or equal to 0.5V separation between the values.

To reset device 12 to its first stable state from its fourth stable state, the voltage $V_{RESETA}$ (corresponding to the reset voltage of resistive switching layer 22-1) is applied across device 12. As shown by line 62 in FIG. 3, this causes the output of device 12 to transition from line LRSA to line HRSA. Following reset operations, device 12 is in its first stable state. If sense voltage $V_{READ}$ is applied to device 12, the resulting current will be $I_1$.

Although the example of FIGS. 2 and 3 involves three resistive switching layers, device 12 may have any suitable number of layers (e.g., two, three, four, five, more than five, etc.). Moreover, it is not necessary for the low and high resistance states for the layers to be ordered as shown in FIG. 3. As one example, the positions of the LRSB curve and the LRSC curve may be reversed.

In another embodiment, if the resistance of LRSB is greater than LRSA, for example, the device 12 exhibits three (or n) output states. For example, in this embodiment, when the device 12 receives $V_{SETC}$, it transitions from HRSC to LRSB. A $V_{RESETA}$ pulse is then applied to the device 12 to return the output of the device to approximately the line HRSB. The device 12, with the resistance of LRSB greater than the resistance of LRSA may then transition between HRSB, HRSC, and LRSB, for three states.

Although multistable switching has been illustrated in scenarios involving positive reset voltages, the reset voltages need not, in general, have the same polarity as the set voltages. When $V_{SET}$ is positive, for example, $V_{RESET}$ may be either positive or negative. A situation in which both $V_{SET}$ and $V_{RESET}$ are positive is illustrated in the example of FIG. 2. In bipolar arrangements, $V_{RESET}$ and $V_{SET}$ may have opposite polarities (i.e., $V_{RESET}$ may be negative, whereas $V_{SET}$ may be positive).

The foregoing is merely illustrative of the principles of this invention and various modifications can be made by those skilled in the art without departing from the scope and spirit of the invention.

What is claimed is:

1. A multistate nonvolatile memory element comprising:
   a first resistive switching layer, which comprises titanium oxide, having a first low resistive state and a first high resistive state;
   a second resistive switching layer, which comprises doped nickel oxide, is connected in series with the first resistive switching layer, the second resistive layer having a second low resistive state and a second high resistive state; and
   a third resistive switching layer, which comprises nickel oxide, is connected in series with the first resistive switching layer and the second switching layer, the third resistive switching layer having a third low resistive state and a third high resistive state, wherein the first resistive switching layer, the second resistive switching layer and the third resistive switching layer exhibit four stable states depending upon a resistance of each layer of said first resistive switching layer, the second resistive switching layer and the third resistive switching layer and allows storage of two bits within the first resistive switching layer, the second resistive switching layer and the third resistive switching layer.

2. The multistate nonvolatile memory element defined in claim 1, wherein the resistance of the first high resistive state is greater than the resistance of the second high resistive state and wherein the resistance of the first low resistive state is greater than the resistance of the second low resistive state.

3. The multistate nonvolatile memory element defined in claim 1, wherein a resistance of the third high resistive state is greater than the resistance of the first low resistive state, the resistance of the third high resistive state is greater than the resistance of the second low resistive state, and the resistance of the third high resistive state is greater than the resistance of the third low resistive state.

4. The multistate nonvolatile memory element defined in claim 3, wherein the resistance of the first high resistive state is greater than the resistance of the second high resistive state, wherein the resistance of the second high resistive state is greater than the resistance of the third high resistive state, wherein the resistance of the first low resistive state is greater than the resistance of the second low resistive state, and wherein the resistance of the first low resistive state is greater than the resistance of the third low resistive state.

5. The multistate nonvolatile memory element defined in claim 3, wherein the resistance of the first high resistive state is greater than the resistance of the second high resistive state, wherein the resistance of the second high resistive state is greater than the resistance of the third high resistive state, and wherein the resistance of the second low resistive state is greater than the resistance of the third low resistive state.

6. The multistate nonvolatile memory element defined in claim 2, wherein:
   the first resistive switching layer switches from the first high resistive state to the first low resistive state when a first set voltage is applied to the multistate nonvolatile memory element;
   the second resistive switching layer switches from the second high resistive state to the second low resistive state when a second set voltage is applied to the multistate nonvolatile memory element; and
   the first resistive switching layer switches from the first low resistive state to the first high resistive state when a reset voltage is applied to the multistate nonvolatile memory element.

7. The multistate nonvolatile memory element defined in claim 6, wherein:
   the nonvolatile memory element has a first output resistance approximately equal to the resistance of the second high resistive state when the first set voltage is applied;

the nonvolatile memory element has a second output resistance approximately equal to the resistance of the first low resistive state when the second set voltage is applied; and the nonvolatile memory element has a third output resistance approximately equal to the resistance of the first high resistive state when the reset voltage is applied.

8. The multistate nonvolatile memory element defined in claim 1, further comprising at least first and second electrodes, wherein at least the first and second resistive switching layers are located between the first and second electrodes.

9. The multistate nonvolatile memory element defined in claim 1, further comprising at least first, second, and third electrodes, wherein at least the first and second resistive switching layers are located between the first and third electrodes and wherein the second electrode is located between the first and second resistive switching layers.

10. The multistate nonvolatile memory element defined in claim 1, further comprising a current steering element connected in series with the first and second resistive switching layers.

11. The multistate nonvolatile memory element defined in claim 10, wherein the current steering element is not in between the first and second resistive switching layers.

12. The multistate nonvolatile memory element defined in claim 1, further comprising a diode connected in series with the first and second resistive switching layers.

13. The multistate nonvolatile memory element defined in claim 1, wherein the first high and low and the second high and low resistance states are a subset of n high and low resistance states each associated with a respective resistive switching layer in the multistate nonvolatile memory element, and wherein the resistive switching layers are formed such that the n high resistance states have higher resistance than a most resistive of the n low resistance states.

14. The multistate nonvolatile memory element defined in claim 13, wherein the most resistive of the n low resistance states is associated with a resistive switching layer that is associated with a most resistive of the n high resistance states.

15. The multistate nonvolatile memory element defined in claim 13, wherein the most resistive of the n low resistance states is associated with one of: 1) a resistive switching layer that is associated with a most resistive of the n high resistance states and 2) a resistive switching layer that is associated with a second most resistive of the n high resistance states.

16. A multistate nonvolatile memory element comprising:
a first layer of resistive switching material, which comprises titanium oxide, having a high resistance state and a low resistance state;
a second layer of resistive switching material, which comprises doped nickel oxide, having a high resistance state and a low resistance state; and
a third layer of resistive switching material, which comprises nickel oxide, having a high resistance state and a low resistance state, wherein the first layer, second layer, and third layer are connected in series and each have a respective resistance, the first layer of resistive switching layer, the second layer of resistive switching layer and the third layer of resistive switching layer exhibit four stable states depending upon a resistance of each layer of said first layer of resistive switching layer, the second layer of resistive switching layer and the third layer of resistive switching layer and allows storage of two bits within the first layer of resistive switching layer, the second layer of resistive switching layer and the third layer of resistive switching layer.

17. The multistate nonvolatile memory element defined in claim 16, wherein the first, second, and third layers comprise metal oxide layers and further comprising:
a plurality of electrodes connected in series with the first, second, and third layers; and
a current steering element connected in series with the first, second, and third layers.

18. The multistate nonvolatile memory element defined in claim 17, wherein the current steering element is not in between the first, second, or third resistive switching layers.

19. The multistate nonvolatile memory element defined in claim 16, wherein the first, second, and third layers each have an associated set voltage at which each layer transitions between its high and low resistance states, wherein the set voltage of the first layer is less than the set voltage of the second layer, and wherein the set voltage of the second layer is less than the set voltage of the third layer.

20. The multistate nonvolatile memory element defined in claim 16, wherein the first layer of resistive switching material has a first set voltage at which the first layer of resistive switching material transitions between its high resistance and low resistance states, wherein the second layer of resistive switching material has a second set voltage at which the second layer of resistive switching material transitions between its high and low resistance states, wherein the third layer of resistive switching material has a third set voltage at which the third layer of resistive switching material transitions between its high resistance and low resistance states, and wherein the first, second, and third set voltages are different.

21. The multistate nonvolatile memory element defined in claim 20, wherein the first layer has a reset voltage at which the first layer transitions from its low resistance state to its high resistance state.

22. The multistate nonvolatile memory element defined in claim 21, wherein:
the multistate nonvolatile memory element has a first resistance substantially equal to the resistance of the first layer in its low resistance state when the third set voltage is applied to the multistate nonvolatile memory element;
the multistate nonvolatile memory element has a second resistance substantially equal to the resistance of the third layer in its high resistance state when the second set voltage is applied to the multistate nonvolatile memory element;
the multistate nonvolatile memory element has a third resistance substantially equal to the resistance of the second layer in its high resistance state when the first set voltage is applied to the multistate nonvolatile memory element; and
the multistate nonvolatile memory element has a fourth resistance substantially equal to the resistance of the first layer in its high resistance state when the reset voltage is applied to the multistate nonvolatile memory element.

23. A multistate nonvolatile memory element, comprising:
a first resistive switching layer, which comprises titanium oxide, having a first low state and a first high state;
a second resistive switching layer, which comprises doped nickel oxide, is connected in series with the first resistive switching layer, the second resistive switching layer having a second high state and a second low state; and
a third resistive switching layer, which comprises nickel oxide, is connected in series with the first resistive switching layer and the second resistive switching layer, the third resistive switching layer having a third high state and a third low state, wherein the first resistive switching layer, the second resistive switching layer and the third resistive switching layer exhibit four stable states depending upon a resistance of each layer of said first resistive switching layer, the second resistive switching layer and the third resistive switching layer, and allows storage of two bits within the first resistive switching layer, the second resistive switching layer and the third resistive switching layer.

24. A multistate nonvolatile memory element, comprising:

a first layer, which comprises titanium oxide, having a first low resistive state and a first high resistive state;

a second layer, which comprises doped nickel oxide, is connected in series with the first layer, the second layer having a second low resistive state and a second high resistive state; and a third layer, which comprises nickel oxide, is connected in series with the first layer and the second layer, the third layer having a third low resistive state and a third high resistive state, wherein the first layer, the second layer and the third layer exhibit four stable states depending upon a resistance of each layer of the first layer, the second layer and the third layer and allows storage of two bits within the first layer, the second layer and the third layer, the multistate nonvolatile memory element outputs approximately the first high resistive state upon application of a reset voltage, outputs approximately the second high resistive state upon application of a first set voltage, and outputs approximately the first low resistive state upon application of a second set voltage.

* * * * *